(12) United States Patent
Nishio

(10) Patent No.: US 8,729,711 B2
(45) Date of Patent: May 20, 2014

(54) SEMICONDUCTOR DEVICE

(75) Inventor: Taichi Nishio, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/562,119

(22) Filed: Jul. 30, 2012

(65) Prior Publication Data

US 2012/0292784 A1  Nov. 22, 2012

Related U.S. Application Data

(63) Continuation of application No. PCT/JP2010/005202, filed on Aug. 24, 2010.

(30) Foreign Application Priority Data

Feb. 23, 2010 (JP) ................................. 2010-037132

(51) Int. Cl.
*H01L 23/522* (2006.01)
(52) U.S. Cl.
USPC .... 257/774; 257/773; 257/777; 257/E23.145; 438/629; 438/667; 438/537
(58) Field of Classification Search
CPC .... H01L 23/481; H01L 23/5226; H01L 29/45
USPC .......... 257/774, 777, 773, E23.145; 438/667, 438/629, 637, 639
See application file for complete search history.

(56) References Cited

U.S. PATENT DOCUMENTS

| | | | |
|---|---|---|---|
| 5,162,241 A | 11/1992 | Mori et al. | |
| 6,524,928 B1 | 2/2003 | Hirabayashi | |
| 7,598,590 B2 * | 10/2009 | Kawano et al. | 257/510 |
| 7,843,064 B2 * | 11/2010 | Kuo et al. | 257/758 |
| 7,843,068 B2 * | 11/2010 | Murayama et al. | 257/773 |
| 7,943,514 B2 * | 5/2011 | West | 438/667 |
| 2003/0057493 A1 | 3/2003 | Hirabayashi | |
| 2006/0006493 A1 * | 1/2006 | Kawano et al. | 257/510 |
| 2006/0118965 A1 | 6/2006 | Matsui | |

(Continued)

FOREIGN PATENT DOCUMENTS

| | | |
|---|---|---|
| JP | 2003-309221 A | 10/2003 |
| JP | 2006-041450 A | 2/2006 |

(Continued)

OTHER PUBLICATIONS

Hozawa et al., Impact of Backside Cu Contamination in the 3D integration Process, 2009 Symposium on VLSI Technology Digest of Technical Papers, pp. 172-173.
International Search Report issued in PCT/JP2010/005202 issued on Oct. 26, 2010.

*Primary Examiner* — Thinh T Nguyen
(74) *Attorney, Agent, or Firm* — McDermott Will Emery LLP

(57) ABSTRACT

A semiconductor device includes a semiconductor substrate having a first surface being an element formation surface, and a second surface opposite to the first surface; a through-hole formed to penetrate the semiconductor substrate from the first surface to the second surface; an insulating film formed on an inner wall of the through-hole; a barrier film formed on the inner wall of the through-hole with the insulating film interposed therebetween; and a conductive portion formed to fill the through-hole provided with the insulating film and the barrier film. A gettering site is formed in a portion of the semiconductor substrate around the through-hole at least near a side of the first surface.

20 Claims, 12 Drawing Sheets

(56) References Cited

U.S. PATENT DOCUMENTS

2009/0075478 A1  3/2009  Matsui
2009/0302430 A1  12/2009  Takahashi et al.
2011/0049717 A1*  3/2011  West .............................. 257/751

FOREIGN PATENT DOCUMENTS

| JP | 2006-041450 A | 2/2006 |
| JP | 2009-295616 A | 12/2009 |
| JP | 2009-295616 A | 12/2009 |

* cited by examiner

FIG.12A
FIG.12B
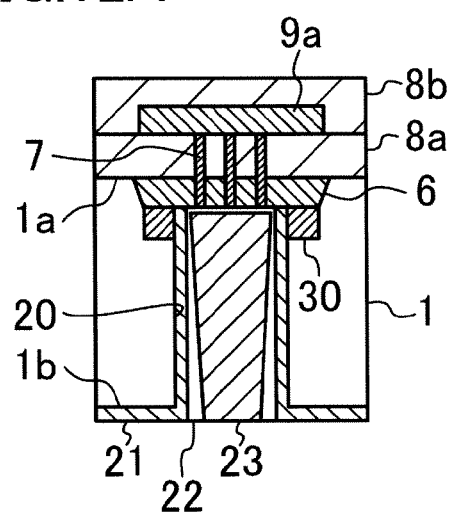
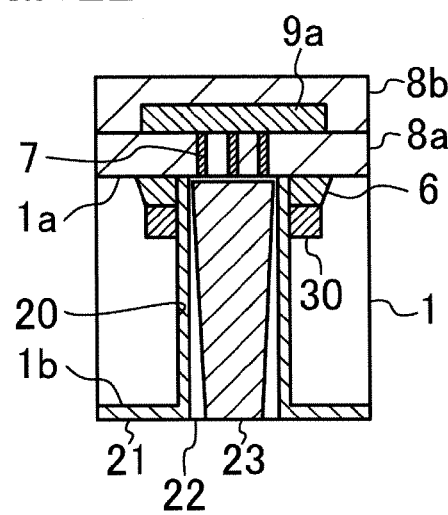

SEMICONDUCTOR DEVICE

CROSS-REFERENCE TO RELATED APPLICATION

This is a continuation of PCT International Application PCT/JP2010/005202 filed on Aug. 24, 2010, which claims priority to Japanese Patent Application No. 2010-037132 filed on Feb. 23, 2010. The disclosures of these applications including the specifications, the drawings, and the claims are hereby incorporated by reference in their entirety.

BACKGROUND

The present disclosure relates to semiconductor devices including through electrodes, and methods of manufacturing the devices.

In recent years, for higher integration of semiconductor devices and integration of various types of semiconductor devices, stacked semiconductor devices formed by stacking a plurality of semiconductor chips in a package have been developed. In most of them, the semiconductor devices to be stacked are electrically connected by wire bonding with a relay substrate such as an interposer interposed between the semiconductor devices. In this structure, since drawn-around wiring for connecting the semiconductor chips is long, parasitic capacitance in the wiring increases with an increase in wiring resistance. This increases an RC delay to limit high-speed operation. In addition, since the area for drawing around the wires increases the size of the entire semiconductor device, miniaturization and reduction in the height of the device have been also limited.

A method of connecting semiconductor devices to be stacked using through electrodes formed by filling through-holes formed in semiconductor devices with metal or conductive resin is known as a solution. (See, for example, Japanese Patent Publication No. 2003-309221). With this structure, the semiconductor devices to be stacked can be connected at the minimum distance, and thus, the interconnection length can be reduced as compared to connection by wire bonding, thereby reducing interconnection resistance and parasitic capacitance. As a result, RC delays are reduced to enable high-speed operation. In addition, since the region for drawing around the wires is not required, only the sizes of the semiconductor devices to be stacked themselves determine the size of the entire stacked semiconductor device. Moreover, the thicknesses of the semiconductor devices to be stacked are reduced, thereby reducing the height of the staked semiconductor device, and thus, the size of the entire semiconductor device can be reduced as compared to the conventional structure.

FIG. 13 is a cross-sectional view of a conventional semiconductor device including a through electrode. As shown in FIG. 13, in a conventional semiconductor device 200, a through-hole 211 is formed in a semiconductor substrate 210 having a first surface 210a which is an integrated circuit formation surface, and a second surface 210b which is opposite to the first surface 210a. The through-hole 211 extends from the first surface 210a to the second surface 210b. An interlayer insulating film 212 including an interconnect layer 213 is formed on the first surface 210a. The through-hole 211 is also formed in the interlayer insulating film 212 to reach the interconnect layer 213. An insulating film 214 is formed on the inner walls of the through-hole 211 and on the second surface 210b. A barrier film 215 is formed on the inner walls of the through-hole 211 with the insulating film 214 interposed therebetween. A conductive portion 216, which serves as a through electrode, is formed to fill the through-hole 211 provided with the insulating film 214 and the barrier film 215. The insulating film 214 electrically insulates the semiconductor substrate 210 from the conductive portion 216. The barrier film 215 reduces diffusion of a conductive material forming the conductive portion 216 into the semiconductor substrate 210.

A method of manufacturing the semiconductor device 200 shown in FIG. 13 will be described below.

First, after forming an integrated circuit etc. (not shown) on the first surface 210a of the semiconductor substrate 210, the interlayer insulating film 212, which includes the interconnect layer 213 electrically connected to the integrated circuit, is formed on the first surface 210a. Then, the back surface (i.e., the surface opposite to the first surface 210a) of the semiconductor substrate 210 is mechanically polished/ground or chemically polished/ground to reduce the thickness of the semiconductor substrate 210. After that, the through-hole 211 is formed from the second surface 210b, which is a new surface of the back surface of the semiconductor substrate 210, to expose the interconnect layer 213 inside the through-hole 211. Next, after forming the insulating film 214 on the inner walls of the through-hole 211 and on the second surface 210b, the barrier film 215 is formed on the inner walls of the through-hole 211 with the insulating film 214 interposed therebetween. Then, the through-hole 211 provided with the insulating film 214 and the barrier film 215 is filled with the metal material to form the conductive portion 216, which serves as a through electrode.

SUMMARY

However, in a conventional semiconductor device including a through electrode, malfunctions occur in active elements (e.g., transistors, diodes, etc.) which include impurity layers.

In view of the problem, it is an objective of the present disclosure to improve the reliability of a semiconductor device including a through electrode.

The present inventor analyzed and studied conventional semiconductor devices to achieve the objective. As a result, he found that diffusion of a metal material forming a through electrode into a semiconductor substrate causes unintended metal contamination, resulting in malfunctions in active elements. The detailed description will follow.

In forming a three-dimensional integrated circuit by connecting chips together or connecting a chip and an interposer, etc. using a through electrode, it is necessary to prevent diffusion of a metal material forming the through electrode into a substrate.

Conventionally, forming a barrier film between a through electrode and a substrate around the electrode has been believed to be an effective method. Specifically, in manufacturing a conventional semiconductor device, after an insulating film covering an inner wall of a through-hole is formed from a back surface (i.e., a second surface) of the substrate, a barrier material is deposited on the insulating film.

However, as shown in FIG. 14, where the barrier film 215 is deposited from the back surface of the substrate by physical vapor deposition (PVD) etc., in particular, where the through-hole 211 has a high aspect ratio (e.g., a diameter of 5 µm, a depth of 50 µm, and an aspect ratio of 10), the barrier film 215 is difficult to deposit with a sufficient thickness in the through-hole 211 at the front surface (i.e., the regions C in FIG. 14) of the substrate. This causes a barrier failure. As a result, the metal material forming the through electrode (i.e., the conductive portion 216) is diffused into the semiconductor substrate 210, thereby causing malfunctions of active elements.

In a semiconductor substrate (i.e., wafer), a defect-free layer, what is called a denuded zone, usually exists in a region with a depth ranging from about 30 μm to about 50 μm from the surface, and a layer having small defects with a density ranging from about $10^8/cm^3$ to $10^9/cm^3$ exists under the denuded zone. These small defects function as gettering sites capturing a metal element which is a source of contamination. However, in a conventional semiconductor device including a through electrode, all or most of the gettering layer including the small defects is removed when reducing the thickness of the substrate. Thus, only the denuded zone eventually remains as the substrate. As a result, as described above, even if a little of the metal material is diffused into the substrate due to a barrier failure, the operation of the active elements are seriously damaged.

The present disclosure was made based on the findings. Specifically, a semiconductor device according to the present disclosure includes a semiconductor substrate having a first surface being an element formation surface, and a second surface opposite to the first surface; a through-hole formed to penetrate the semiconductor substrate from the first surface to the second surface; an insulating film formed on an inner wall of the through-hole; a barrier film formed on the inner wall of the through-hole with the insulating film interposed therebetween; and a conductive portion formed to fill the through-hole provided with the insulating film and the barrier film. A gettering site is formed in a portion of the semiconductor substrate around the through-hole at least near a side of the first surface.

In the semiconductor device according to the present disclosure, the gettering site is formed around the region of the through-hole in which the barrier film is difficult to form with a sufficient thickness, i.e., around the through-hole near the first surface of the semiconductor substrate. Thus, even if the metal material forming the conductive portion which functions as the through electrode is diffused into the semiconductor substrate, the metal material can be reliably gettered. This reliably reduces malfunctions of active elements caused by unintended metal contamination. Therefore, the reliability of a semiconductor device including a through electrode can be improved.

In a semiconductor device including a through electrode, the metal material forming the through electrode has a significantly different thermal expansion coefficient from the substrate material, thereby causing stress around the through electrode. As a result, in the region near the through electrode, carrier mobility is changed by the stress to influence the operation of the active elements. Thus, a buffer region without active elements is provided very close to the through electrode. That is, a semiconductor device including a through electrode has the problem that the area efficiency of an integrated circuit decreases depending on the location of a buffer region.

However, in the semiconductor device according to the present disclosure, the gettering site is formed in the buffer region which is very close to the through electrode and in which no active element can be provided, thereby efficiently utilizing the area of the first surface, i.e., the element formation surface. The size required as the buffer region depends on the diameter of the through electrode. For example, the buffer region required for the through electrode with a diameter of about 1 μm is a region with a radius of about 5 μM around the through electrode.

In the semiconductor device according to the present disclosure, a minimum distance from a center of the through-hole to the gettering site may be shorter than a minimum distance from the center of the through-hole to an active element formation region in the semiconductor substrate. This structure efficiently getters the metal which is a source of contamination.

In the semiconductor device according to the present disclosure, elements formed on the first surface (i.e., the element formation surface) of the semiconductor substrate include an active element such as a diode and a transistor, which has an impurity layer. Such a region provided with the active elements is referred to as an active element formation region. The "minimum distance from the center of the through-hole to an active element formation region" means the distance from the center of the through-hole to the active element formation region which is closest to the through-hole. The "minimum distance from a center of the through-hole to the gettering site" means the distance from the center of the through-hole to the gettering site which is closest to the through-hole.

In the semiconductor device according to the present disclosure, the gettering site may be formed to surround the through-hole. This structure efficiently getters the metal which is a source of contamination.

In the semiconductor device according to the present disclosure, a size of the through-hole may decrease from the second surface toward the first surface. This structure reduces the area of the through electrode on the element formation surface, and thus, the semiconductor device including the through electrode with high area efficiency can be formed.

In the semiconductor device according to the present disclosure, an interconnect may be formed on the first surface of the semiconductor substrate. The conductive portion may be electrically connected to the interconnect. In this case, the conductive portion may be electrically connected to the interconnect by a contact interposed between the conductive portion and the interconnect.

In the semiconductor device according to the present disclosure, the through-hole may include a plurality of through-holes. The gettering site may be formed to surround a through-hole group formed by two-dimensionally arranging three or more of the plurality of through-holes. That is, where the plurality of through electrodes are provided in the semiconductor device according to the present disclosure, and the through electrode group are formed by two-dimensionally and concentrically arranging three or more through electrodes for design reasons, a semiconductor device can be provided, which includes a through electrode formed with high area efficiency, by forming a gettering site to surround the through electrode group.

In the semiconductor device according to the present disclosure, an insulating region may be formed in a surface portion of the semiconductor substrate around the through-hole at a side of the first surface. The gettering site may be formed under the insulating region. This reliably insulates the semiconductor substrate from the through electrode. In this case, an isolation may be formed in the surface portion of the semiconductor substrate at the side of the first surface. The insulating region may be formed to a substantially same depth as the isolation. The through-hole may be formed from a lower surface of the insulating region to the second surface.

A stacked semiconductor device according to the present disclosure is formed by stacking a plurality of semiconductor devices. At least one of the semiconductor devices is the semiconductor device according to the present disclosure.

In the stacked semiconductor device according to the present disclosure, malfunctions of the active elements caused by unintended metal contamination can be reliably reduced, thereby providing a highly stable and reliable stacked semiconductor device.

A method of manufacturing a semiconductor device according to the present disclosure includes (a) forming a gettering site in a portion of the semiconductor substrate around a through-hole formation region at least near a side of an element formation surface; (b) forming a through-hole to penetrate the semiconductor substrate from the element formation surface to an opposite surface; (c) forming an insulating film on an inner wall of the through-hole; (d) forming a barrier film on the inner wall of the through-hole with the insulating film interposed therebetween; and (e) forming a conductive portion to fill the through-hole provided with the insulating film and the barrier film. The step (a) of forming the gettering site may be performed before the step (b) of forming the through-hole, or after the step (b) of forming the through-hole, or after the step (e) of forming the conductive portion (i.e., a through electrode).

In the method of manufacturing the semiconductor device according to the present disclosure, the gettering site is formed around the through-hole (i.e., the through electrode) near the first surface (i.e., the element formation surface) of the semiconductor substrate. Thus, even if the metal material forming the conductive portion which functions as the through electrode is diffused into the semiconductor substrate, the metal material can be reliably gettered. This reliably reduces malfunctions of the active elements caused by unintended metal contamination. Therefore, the reliability of a semiconductor device including a through electrode can be improved.

In the method of manufacturing the semiconductor device according to the present disclosure, in the step (a), the gettering site may be formed by exposing the element formation surface of the semiconductor substrate to impurity-containing gas, or by performing ion-implantation of impurities into the element formation surface of the semiconductor substrate.

In the method of manufacturing the semiconductor device according to the present disclosure, the step (a) may be performed before the step (b). Alternatively, the step (a) may be performed after the step (b). In the latter case, the step (a) may be performed after the step (e).

According to the present disclosure, the gettering site is formed around the through electrode near the element formation surface of the semiconductor substrate, thereby reducing metal contamination caused by the metal material forming the through electrode. The reliability of the semiconductor device can be thus improved.

The present disclosure relates to a semiconductor device including a through electrode and a method of manufacturing the device, which reduce bad influences of metal contamination from a through electrode near an element formation surface of a semiconductor substrate on active elements, and is thus useful.

BRIEF DESCRIPTION OF THE DRAWINGS

FIG. 1A is a cross-sectional view of the semiconductor device. FIG. 1B is a top view of the semiconductor device. Note that active elements are not shown.

FIGS. 12A and 12B are cross-sectional views illustrating a variation of the connecting portion between the through electrode and an interconnect in the semiconductor device according to the variation of the first embodiment.

DETAILED DESCRIPTION

Embodiments of the present disclosure will be described hereinafter with reference to the drawings. Note that materials, numerical values, etc. used in the embodiments are merely examples, and the present disclosure is not limited thereto. These embodiments may be modified as appropriate without departing from the technical spirit and scope of the present disclosure. Furthermore, a combination of these embodiments is possible.

First Embodiment

A semiconductor device according to a first embodiment of the present disclosure will be described hereinafter with reference to the drawings.

Figure 1A:
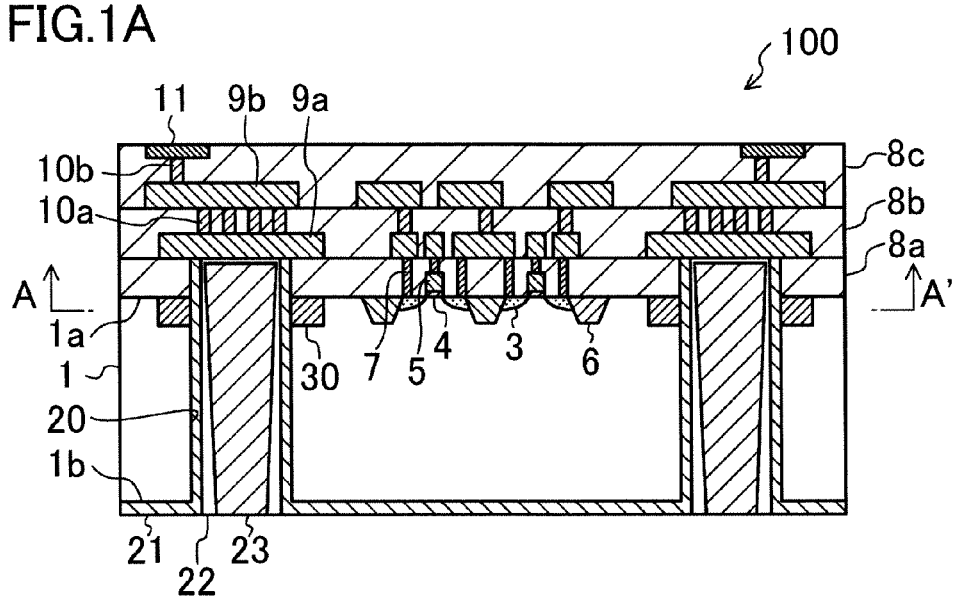
FIGS. 1A and 1B illustrate a semiconductor device according to a first embodiment of the present disclosure.
Figure 1B:
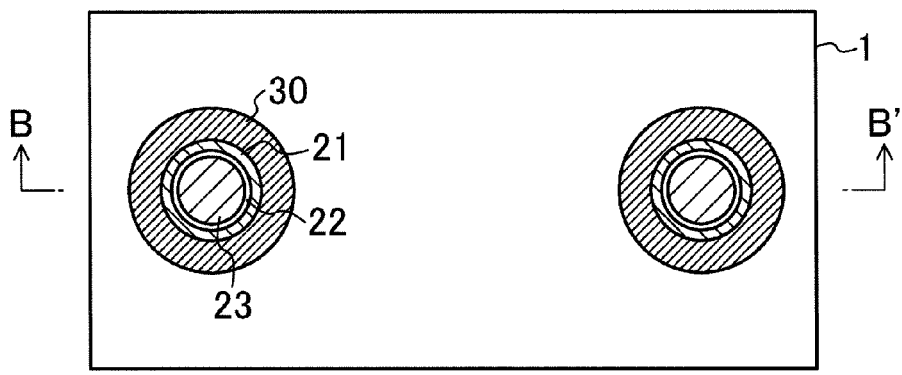

FIGS. 1A and 1B illustrate the semiconductor device according to the first embodiment. FIG. 1A is a cross-sectional view of the semiconductor device. FIG. 1B is a top view of the semiconductor device. Note that active elements, isolations, etc. are not shown. FIG. 1A is the cross-sectional view taken along the plane B-B' of FIG. 1B. FIG. 1B is the top view taken along the plane A-A' of FIG. 1A.

As shown in FIG. 1A, in a semiconductor device 100 according to this embodiment, impurity regions 3 for active elements such as transistors and diodes are formed in a surface portion of the semiconductor substrate 1 at a first surface 1a. Gate electrodes 5 are formed on the first surface 1a of the semiconductor substrate 1 with the gate insulating film 4 interposed therebetween. The active elements are electrically insulated from each other by each isolation 6 formed in the surface portion of the semiconductor substrate 1 at the first surface 1a. A first interlayer insulating film 8a is formed on the first surface 1a of the semiconductor substrate 1 to cover the gate electrodes 5. A plurality of contacts 7, which are connected to the impurity regions 3 and the gate electrodes 5, are formed in the first interlayer insulating film 8a. A second interlayer insulating film 8b is formed on the first interlayer insulating film 8a. A first interconnect 9a and first vias 10a connected to the first interconnect 9a are formed in the second interlayer insulating film 8b. The first interconnect 9a is connected to the contacts 7, transmits a signal, and supplies a power supply voltage in the semiconductor device 100. A third interlayer insulating film 8c is formed on the second interlayer insulating film 8b. A second interconnect 9b and second vias 10b connected to the second interconnect 9b are formed in the third interlayer insulating film 8c. The second interconnect 9b is connected to the first vias 10a, transmits a signal, and supplies a power supply voltage in the semiconductor device 100. Electrode pads 11 connected to the second vias 10b and for extracting signals to the outside are formed on the third interlayer insulating film 8c.

As shown in FIG. 1A, through-holes 20 are formed to penetrate the semiconductor substrate 1 from the first surface 1a to a second surface 1b. Each of the through-holes 20 is also formed in the first interlayer insulating film 8a to reach the first interconnect 9a. An insulating film 21 is formed on the inner walls of the through-holes 20 and on the second surface 1b. A barrier film 22 is formed on the inner walls of the through-holes 20 with the insulating film 21 interposed therebetween. The barrier film 22 is also formed on the surface (lower surface) of the first interconnect 9a in the corresponding one of through-holes 20. Conductive portions 23, which serve as through electrodes, are formed to fill the through-holes 20 provided with the insulating film 21 and the barrier film 22. This electrically connects each of the conductive portions 23 to the first interconnect 9a. The insulating film 21 electrically insulates the semiconductor substrate 1 from the conductive portions 23. The barrier film 22 prevents a conductive material forming the conductive portions 23 from being diffused into the semiconductor substrate 1. In order to reduce contact resistance between the first interconnect 9a and the corresponding one of the conductive portions 23 serving as the through electrodes, the thickness of the barrier film 22 on the surface (lower surface) of the first interconnect 9a in the corresponding one of the through-holes 20 is preferably reduced as much as possible by a known technique such as resputtering or the barrier film 22 itself is preferably removed.

In the semiconductor device 100 according to this embodiment, as shown in FIGS. 1A and 1B, each gettering site 30 is formed in a portion of the semiconductor substrate 1 around one of the through-holes 20, i.e., the through electrodes, at least near the first surface 1a. That is, the gettering sites 30 are formed around the through-holes 20 near the first surface 1a, in which the barrier film 22 is difficult to form with a sufficient thickness, to address metal contamination caused by the metal material forming the conductive portions 23 which serve as the through electrodes. This allows the gettering sites 30 to reliably capture contaminated metal, thereby reducing diffusion of the contaminated metal into the semiconductor substrate 1. Therefore, malfunctions of the active elements caused by the unintended metal contamination can be reliably reduced, thereby improving the reliability of the semiconductor device 100 including the through electrodes.

In order to reduce an influence of stress, which is caused by a difference between the thermal expansion coefficient of the metal material forming the through electrodes and the thermal expansion coefficient of the substrate material, etc., on the operation of the active elements, a buffer region without active elements needs to be provided around the through electrodes. By contrast, in this embodiment, the gettering sites 30 are provided in the buffer region, thereby providing the semiconductor device 100 including the through electrodes with high area efficiency. The size required as the buffer region depends on the diameter of each through electrode. For example, the buffer region required for a through electrode with, for example, a diameter of about 1 μm is a region with a radius of about 5 μm around the through electrode.

In this embodiment, each of the gettering sites 30 is formed to surround the corresponding one of the through-holes 20, and thus the metal which is a source of contamination can be efficiently gettered.

In this embodiment, the minimum distance from the center of a through-hole 20 to the corresponding gettering site 30 is preferably shorter than the minimum distance from the center of the through-hole 20 to the corresponding active element formation region of the semiconductor substrate 1. This efficiently getters the metal which is a source of contamination. In this embodiment, the "minimum distance from the center of the through-hole 20 to the corresponding active element formation region" means the distance from the center of the through-hole 20 to the active element formation region which is closest to the through-hole 20. The "minimum distance from the center of a through-hole 20 to the corresponding gettering site 30" means the distance from the center of the through-hole 20 to the gettering site 30 which is closest to the through-hole 20.

While in the semiconductor device 100 according to this embodiment shown in FIG. 1A, a double-layer interconnect structure is shown as an example, the number of the interconnect layers may be changed as appropriate. That is, the present disclosure is clearly not limited to the double-layer interconnect structure.

A method of manufacturing the semiconductor device according to the first embodiment will be described hereinafter with reference to the drawings.

FIGS. 2A-2C, 3A-3C, 4A, and 4B are cross-sectional views illustrating steps of the method of manufacturing the semiconductor device according to the first embodiment.

Figure 2A:
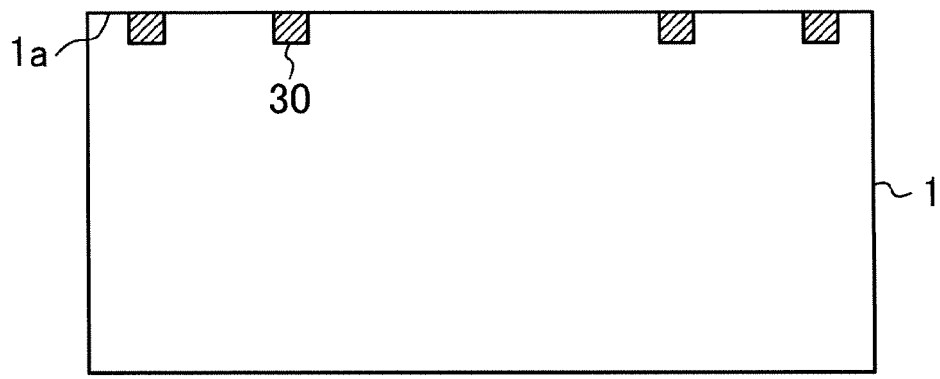
FIGS. 2A-2C are cross-sectional views illustrating steps of a method of manufacturing the semiconductor device according to the first embodiment.

First, as shown in FIG. 2A, a resist pattern (not shown) is formed on the first surface (element formation surface) 1a of the semiconductor substrate 1 using a known technique such as lithography. The resist pattern has openings with, for example, a width ranging from about 50 nm to about 1000 nm (preferably from about 200 nm to about 500 nm) around through electrode formation regions. Then, the first surface 1a of the semiconductor substrate 1 is exposed to $POCl_3$ gas at, for example, a temperature of about 1000° C. for about 30 minutes using the resist pattern as a mask. This diffuses phosphorus at, for example, a concentration about $1 \times 10^{20}/cm^3$ from the first surface 1a of the semiconductor substrate 1 around the through electrode formation regions. As a result, regions with a phosphorus concentration of about $1 \times 10^{18}/cm^3$ or more is formed to a depth of about 500 nm from the first surface 1a, and the regions diffused with the high concentration phosphorus function as the gettering sites 30.

While in this embodiment, the gettering sites 30 which are the regions diffused with the high concentration phosphorus are formed using $POCl_3$ gas, the present disclosure is not limited thereto. The gettering sites 30 which are the regions diffused with the high concentration phosphorus may be formed using $PBr_3$ gas etc. Alternatively, the regions diffused with the high concentration phosphorus may be formed, for example, by ion implantation. Furthermore, ion implantation may be used to form crystal defects in the surface portion of the semiconductor substrate 1 at the first surface 1a, thereby forming the gettering sites. In this case, the implanting energy, the dose, etc. need to be controlled.

Figure 2B:
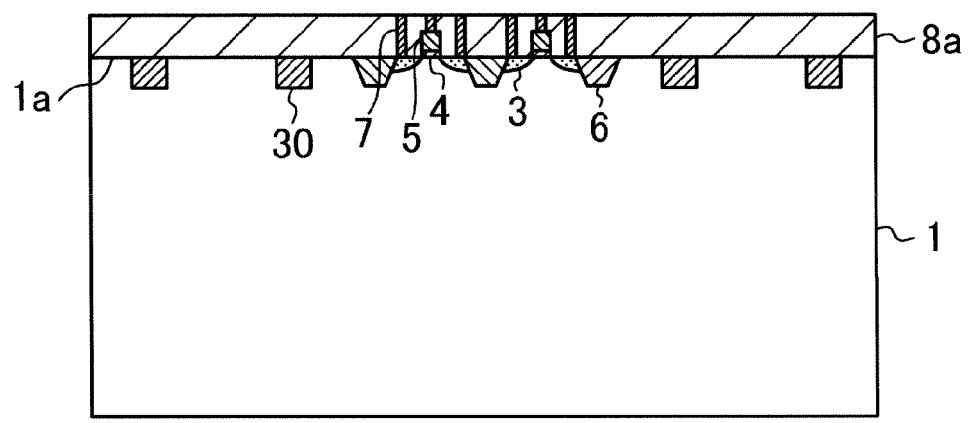

Then, as shown in FIG. 2B, the isolations 6 for electrically insulating the active elements from each other, and the impurity regions 3 of the active elements such as transistors and diodes are formed in the surface portion of the semiconductor substrate 1 at the first surface 1a. Next, after the gate electrodes 5 are formed on the first surface 1a of the semiconductor substrate 1 with the gate insulating film 4 interposed therebetween, the first interlayer insulating film 8a is formed on the first surface 1a of the semiconductor substrate 1 to cover the gate electrodes 5. Then, the contacts 7 connected to the impurity regions 3 and the gate electrodes 5 are formed in the first interlayer insulating film 8a.

Figure 2C:
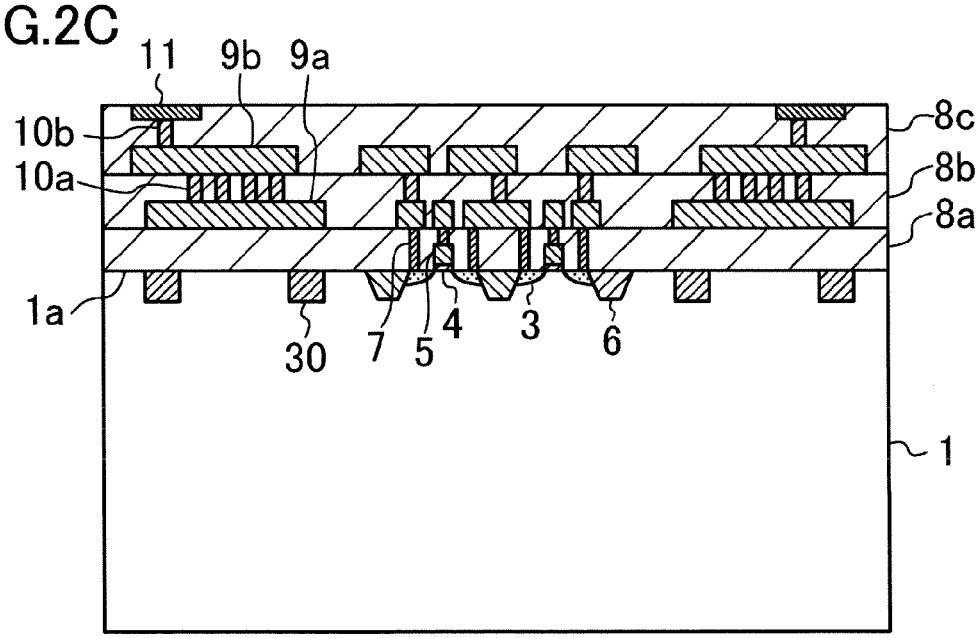

After that, as shown in FIG. 2C, after the second interlayer insulating film 8b is formed on the first interlayer insulating film 8a, the first interconnect 9a and the first vias 10a connected to the first interconnect 9a are formed in the second interlayer insulating film 8b. The first interconnect 9a is connected to the contacts 7, transmits a signal, and supplies a power supply voltage in the semiconductor device. Then, after the third interlayer insulating film 8c is formed on the second interlayer insulating film 8b, the second interconnect 9b and the second vias 10b connected to the second interconnect 9b are formed in the third interlayer insulating film 8c. The second interconnect 9b is connected to the first vias 10a, transmits a signal, supplies a power supply voltage in the semiconductor device. After that, the electrode pads 11 connected to the second vias 10b and for extracting signals to the outside are formed on the third interlayer insulating film 8c.

Figure 3A:
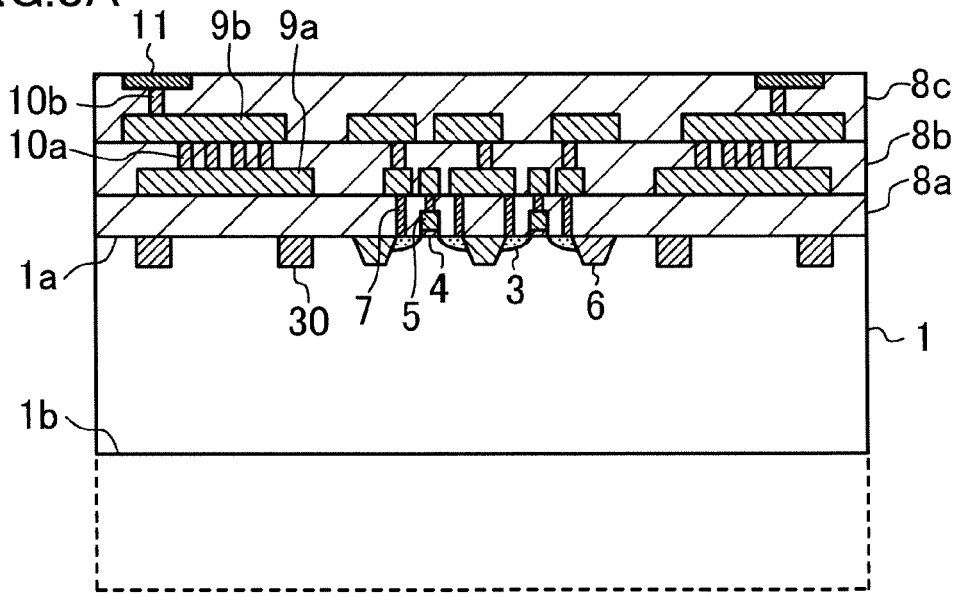
FIGS. 3A-3C are cross-sectional views illustrating steps of the method of manufacturing the semiconductor device according to the first embodiment.

Then, as shown in FIG. 3A, the thickness of the semiconductor substrate 1 is reduced from the surface of the semiconductor substrate 1 opposite to the first surface 1a to an eventual thickness ranging from about 5 µm to about 100 µm (preferably from about 20 µm to about 50 µm). A new surface apparent at the side of the semiconductor substrate 1 opposite to the first surface 1a is the second surface 1b. In this embodiment, in the step of reducing the thickness of the substrate, for example, mechanical cutting/polishing such as grinding, chemical polishing such as chemical mechanical polishing (CMP), dry etching, or wet etching may be used.

In the step of reducing the thickness of the substrate, the smaller the eventual thickness of the substrate is, the smaller the strength of the substrate is, thereby causing problems such as cracks. In order to reduce the problems, in the step of reducing the thickness of the substrate or a subsequent step, the substrate may be reinforced by bonding a support substrate on the top of the substrate using an adhesive, etc.

Figure 3B:
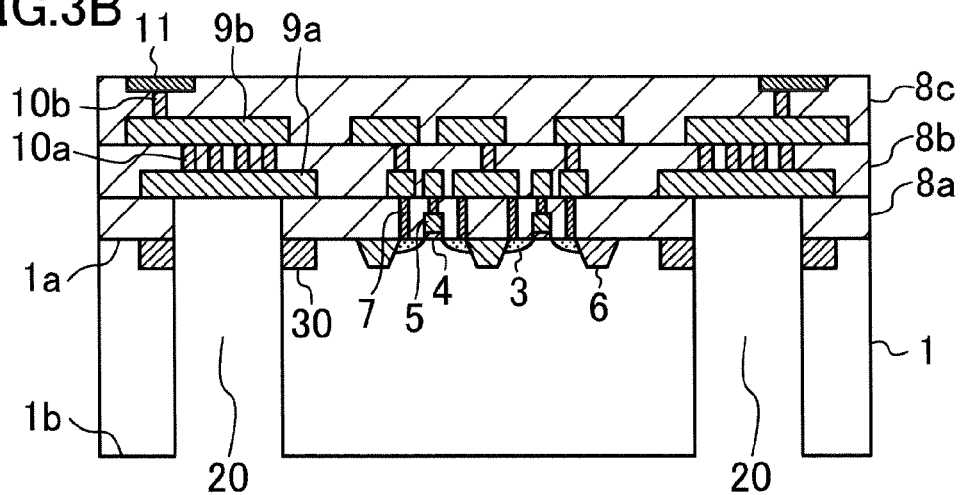

Next, as shown in FIG. 3B, each of the through-holes 20, which penetrates the semiconductor substrate 1 and the first interlayer insulating film 8a to reach the first interconnect 9a, is formed from the second surface 1b of the semiconductor substrate 1. The size of each through-hole 20 ranges, for example, from about 0.1 µm to about 20 µm (preferably from about 0.5 µm to 10 µm). Note that the through-holes 20 are formed to avoid the active element formation regions. The through-holes 20 are formed so that the gettering sites 30 surround the through-holes 20. Each of the gettering sites 30 may also be formed in one of the through-hole formation region in the step shown in FIG. 2A so that the through-hole 20 is reliably in contact with the gettering site 30.

In this embodiment, a known technique is used to form the through-holes 20. For example, the resist pattern (not shown) having openings in the through-hole formation regions is formed on the second surface 1b using lithography. Then, the through-holes 20 may be formed by etching such as dry etching and wet etching using the resist pattern as a mask. Alternatively, in place of etching, the through-holes 20 may be formed using a laser (e.g., a $CO_2$ laser and an yttrium aluminum garnet (YAG) laser).

Figure 3C:
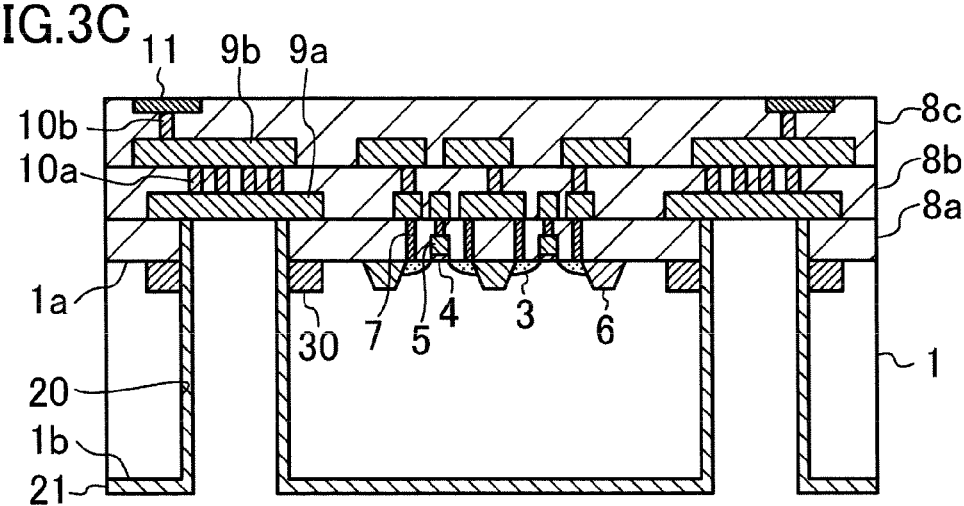

After that, as shown in FIG. 3C, the insulating film 21 is formed on the second surface 1b and on the inner walls of the through-holes 20 from the second surface 1b of the semiconductor substrate 1. The insulating film 21 may be made of, for example, $SiO_2$, etc. The insulating film 21 formed on the surface (lower surface) of the first interconnect 9a in the corresponding one of the through-holes 20 is removed by, for example, dry etching, wet etching, etc.

Figure 4A:
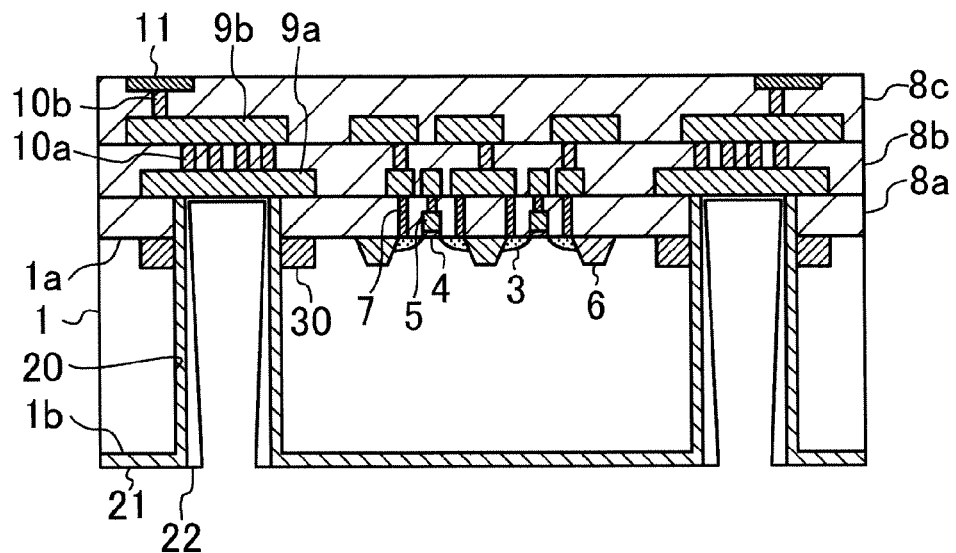
FIGS. 4A and 4B are cross-sectional views illustrating steps of the method of manufacturing the semiconductor device according to the first embodiment.

Then, as shown in FIG. 4A, the barrier film 22 is formed on the inner walls of the through-holes 20 from the second surface 1b of the semiconductor substrate 1 with the insulating film 21 interposed between the barrier film 22 and the inner walls of the through-holes 20. The barrier film 22 is preferably made of a material having characteristics as a barrier against the conductive material forming the through electrodes. The barrier film 22 may be made of, for example, Ta, TaN, Ti, TiN, etc., or a combination thereof.

The barrier film 22 is also formed on the surface (lower surface) of the first interconnect 9a in the correspond one of the through-holes 20. The barrier film 22 tends to be thin on the inner walls of the through-holes 20 near the first surface (i.e., the element formation surface) 1a. However, in this embodiment, the gettering sites 30 are formed around the through-holes 20 near the first surface 1a, in which the barrier film 22 tends to be thin, to address metal contamination caused by the metal material forming the through electrodes. This allows the gettering sites 30 to reliably capture contaminated metal, thereby reducing diffusion of the contaminated metal into the semiconductor substrate 1. Therefore, malfunctions of the active elements caused by the unintended metal contamination can be reliably reduced, thereby improving the reliability of the semiconductor device including the through electrodes.

Figure 4B:
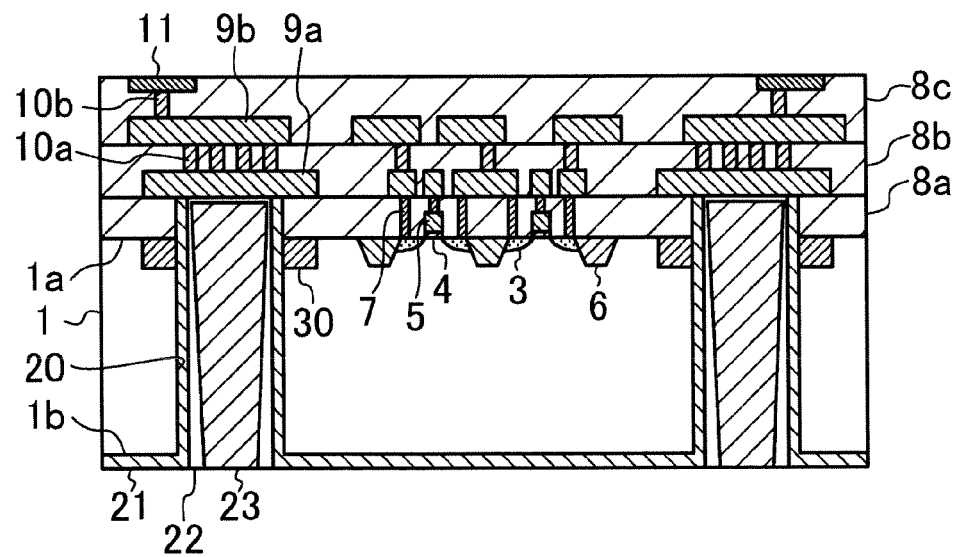

Finally, as shown in FIG. 4B, the conductive portions 23 which serve as through electrodes are formed to fill the through-holes 20 provided with the insulating film 21 and the barrier film 22. The conductive portions 23 are made of, for example, Cu, W, Au, Ni, etc. A most suitable means for filling the conductive portions 23 is selected depending on the conductive material to be used. The means for filling the conductive portions 23 may be, for example, electrolytic plating, non-electrolytic plating, chemical vapor deposition, etc.

While in this embodiment, the gettering sites 30 are formed before forming the through-holes 20, the gettering sites 30 may be formed after forming the through-holes 20, or after forming the conductive portions (i.e., the through electrodes) 23.

A stacked semiconductor device, which is formed by stacking a plurality of semiconductor devices including at least one of the semiconductor device according to this embodiment, will be described hereinafter with reference to the drawings.

Figure 5:
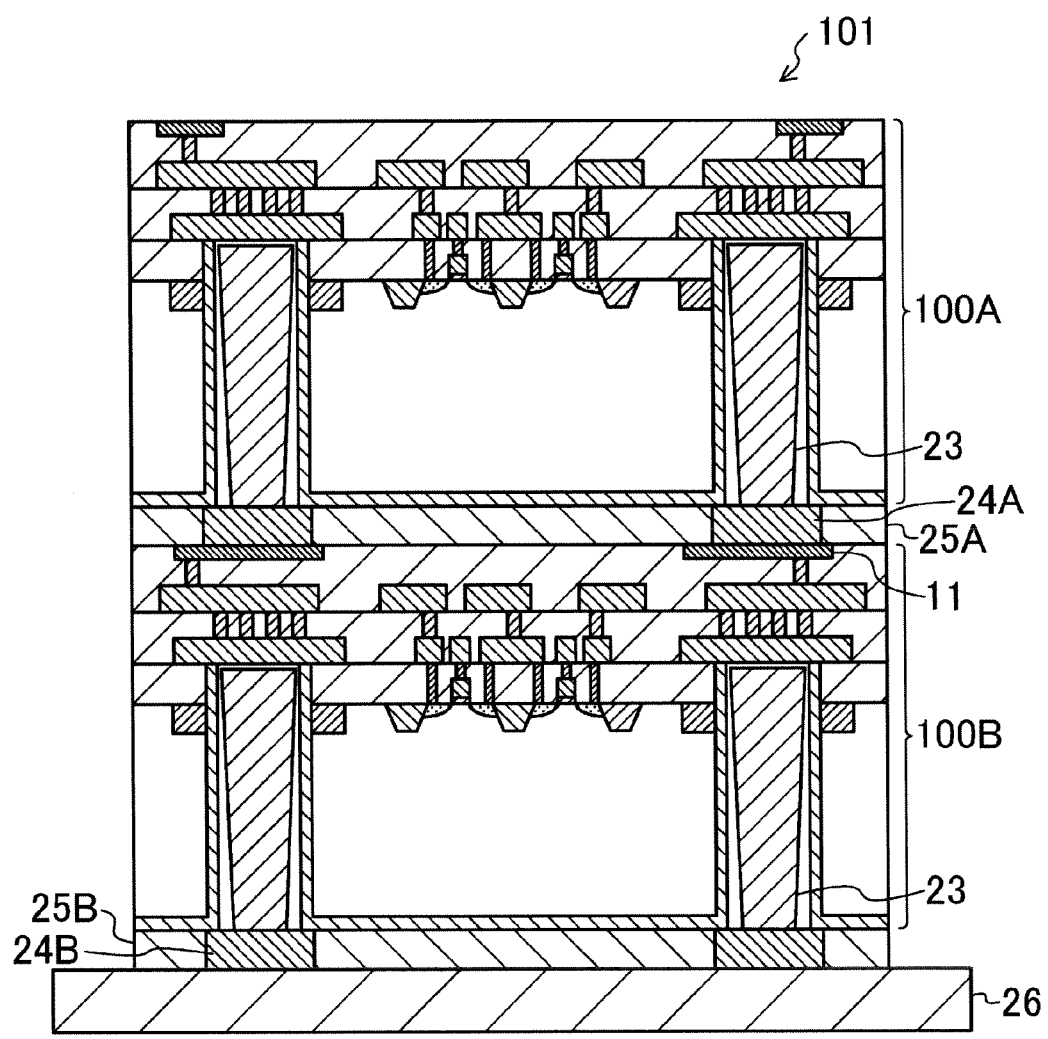
FIG. 5 is a cross-sectional view of a stacked semiconductor device formed by stacking two of the semiconductor devices according to the first embodiment.

FIG. 5 is a cross-sectional view of a stacked semiconductor device formed by stacking two of the semiconductor devices according to this embodiment shown in FIG. 1A. As shown in FIG. 5, a semiconductor device 100A (on the upper side) and a semiconductor device 100B (on the lower side) are stacked on the interposer 26 in a stacked semiconductor device 101. The semiconductor devices 100A and 100B have the same structure as the semiconductor device according to this embodiment shown in FIG. 1A. The conductive portions 23 exposed to the second surface 1b of the semiconductor device 100A are electrically connected to the electrode pads 11 of the semiconductor device 100B via bumps 24A made of, for example, solder, etc. The semiconductor device 100A is bonded to the semiconductor device 100B by an underfill material 25A. The conductive portions 23 exposed to the second surface 1B of the semiconductor device 100B are electrically connected to the interposer 26 via bumps 24B made of, for example, solder, etc. The semiconductor device 100B is bonded to the interposer 26 by an underfill material 25B. In order to electrically connect the devices, direct bonding of the metals may be used in place of the bumps.

In the stacked semiconductor device 101 shown in FIG. 5, the semiconductor device 100A is connected to the semiconductor device 100B at the minimum distance. As a result, as compared to a conventional stacked semiconductor device using wire bonding, the smaller stacked semiconductor device 101 not requiring an area for drawing around wires can be provided.

Figure 6A:
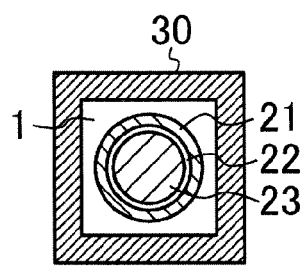
FIG. 6A-6D illustrate variations of the planer shape of a gettering site surrounding a through electrode in the semiconductor device according to the first embodiment.
Figure 6B:
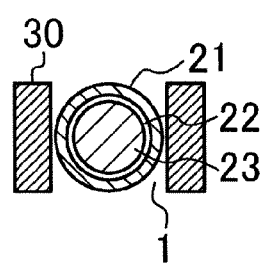

While in the semiconductor device according to this embodiment, as shown in FIG. 1B, each gettering site 30 surrounding the through electrode (i.e., the conductive portion 23) has a circular shape (a doughnut shape) as viewed from above, the present disclosure is not limited thereto. For example, as shown in FIG. 6A, a gettering site 30, which has a polygonal shape such as a rectangular shape as viewed from above, may be formed around a through electrode. If the gettering site 30 has sufficient gettering properties, there is no need for the gettering site 30 to surround the entire circumference of the corresponding one of the through electrodes. For example, as shown in FIG. 6B, gettering sites 30 may be located in a determined direction viewed from a through electrode. While FIG. 1B illustrates that the gettering site 30 is formed in contact with the insulating film 21 covering the through electrode, the present disclosure is not limited thereto. In view of misalignment, a space of, for example, about 1 μm may be provided between each gettering site 30 and the insulating film 21 covering the through electrodes.

Figure 6C:
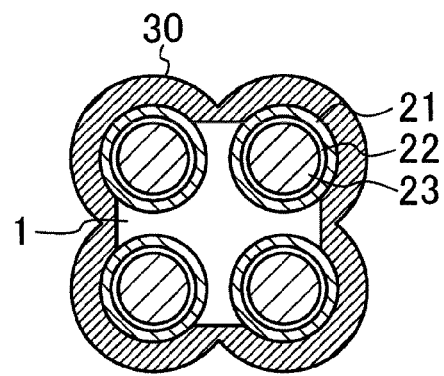
Figure 6D:
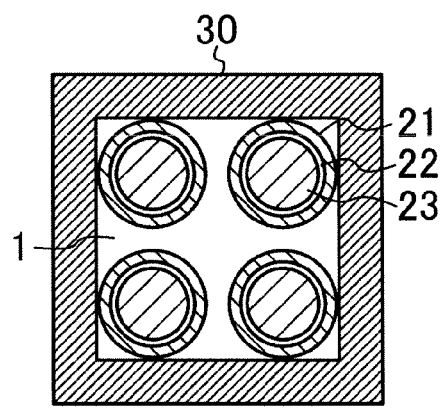

For design reasons, where a through electrode group formed by densely arranging a plurality (e.g., three or more) of through electrodes, and no active element is formed between the through electrodes forming the through electrode group, for example, as shown in FIG. 6C or FIG. 6D, a gettering site 30 may be formed not to surround the through electrodes individually, but to surround the through electrode group as a whole.

Figure 7A:
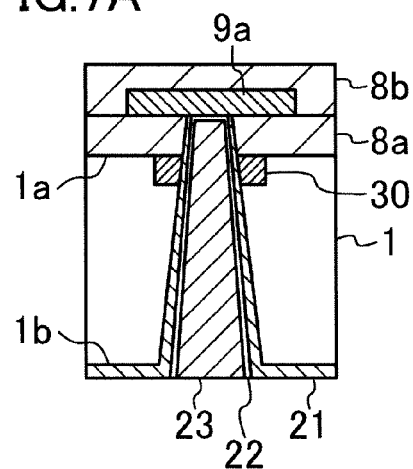
FIGS. 7A and 7B illustrate variations of the cross-sectional shape of the through-hole in the semiconductor device according to the first embodiment.
Figure 7B:
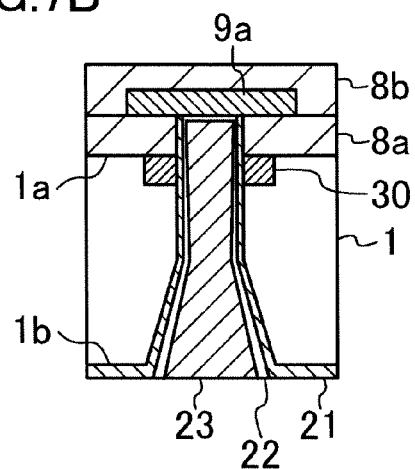

While in the semiconductor device according to this embodiment, as shown in FIG. 1A, the sizes of the through-holes 20 are the same from the first surface 1a to the second surface 1b, the present disclosure is not limited thereto. The sizes of the through-holes 20 near the first surface 1a may be smaller than the sizes of the through-holes 20 near the second surface 1b. With this structure, the area for the through electrodes at the first surface 1a (i.e., the element formation surface) is reduced, thereby providing the semiconductor device 100 including the through electrodes with high area efficiency. Specifically, for example, as shown in FIG. 7A, the entire inner wall of each through-hole 20 may have a taper cross-sectional shape so that the size of the through-hole 20 gradually decreases from the second surface 1b toward the first surface 1a. Alternatively, for example, as shown in FIG. 7B, part of the inner wall of each through-hole 20 (near the second surface 1b) may have a taper cross-sectional shape, and the other part of the inner wall of the through-hole 20 (near the first surface 1a) may have a vertical cross-sectional shape.

While in the semiconductor device according to this embodiment, as shown in FIG. 1B, each through-hole 20 has a circular shape as viewed from above, the present disclosure is not limited thereto. If other shapes are desired for design, process reasons, etc., the planar shape of each through-hole 20 may be other than the circular shape, and may be, for example, a polygonal shape, an oval shape, etc.

Figure 8:
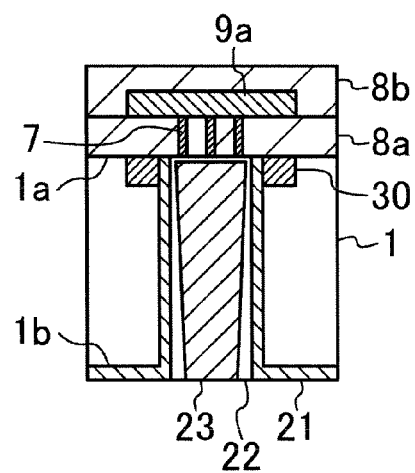
FIG. 8 is a cross-sectional view illustrating a variation of the connecting portion between the through electrode and an interconnect in the semiconductor device according to the first embodiment.

While in the semiconductor device according to this embodiment, as shown in FIG. 1A, each of the through electrodes (i.e., the conductive portions 23) is directly connected to the first interconnect 9a, the present disclosure is not limited thereto. Each of the through electrodes may be directly connected to the second interconnect 9b, or one of the electrode pads 11. Alternatively, as shown in FIG. 8, each through-hole 20 (i.e., each through electrode) may be formed only in the semiconductor substrate 1. In other words, the through-hole 20 (i.e., the through electrode) is not formed in the first interlayer insulating film 8a, and the through electrode (i.e., the conductive portion 23) is electrically connected to the first interconnect 9a by at least one of the contacts 7 formed in the first interlayer insulating film 8a.

Variation of First Embodiment

A semiconductor device according to a variation of the first embodiment will be described hereinafter with reference to the drawings.

Figure 9:
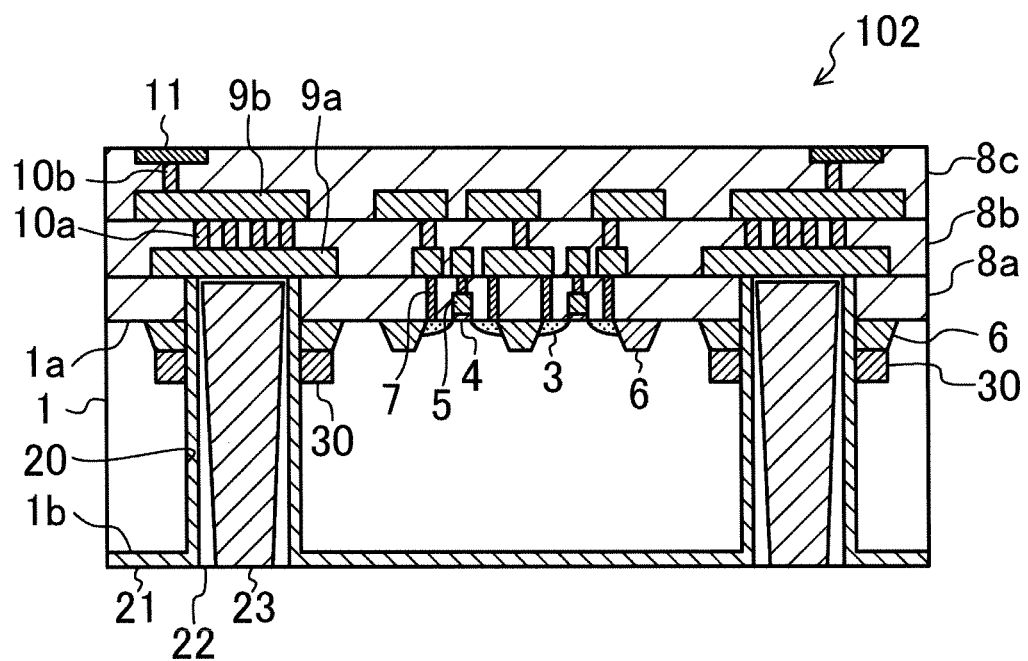
FIG. 9 is a cross-sectional view of a semiconductor device according to a variation of the first embodiment.

FIG. 9 illustrates the cross-sectional structure of the semiconductor device according to the variation of the first embodiment. The semiconductor device according to this variation is a variation of the semiconductor device according to the first embodiment shown in FIGS. 1A and 1B. In FIG. 9, the same reference characters as those in the first embodiment are used to represent equivalent elements.

As shown in FIG. 9, in a semiconductor device 102 according to this variation, impurity regions 3 for active elements such as transistors and diodes are formed in a surface portion of a semiconductor substrate 1 at a first surface 1a. Gate electrodes 5 are formed on the first surface 1a of the semiconductor substrate 1 with the gate insulating film 4 interposed therebetween. The active elements are electrically insulated from each other by each isolation 6 formed in the surface portion of a semiconductor substrate 1 at the first surface 1a. A first interlayer insulating film 8a is formed on the first surface 1a of the semiconductor substrate 1 to cover the gate electrodes 5. A plurality of contacts 7, which are connected to the impurity regions 3 and the gate electrodes 5, are formed in the first interlayer insulating film 8a. A second interlayer insulating film 8b is formed on the first interlayer insulating film 8a. A first interconnect 9a and first vias 10a connected to the first interconnect 9a are formed in the second interlayer insulating film 8b. The first interconnect 9a is connected to the contacts 7, transmits a signal, and supplies a power supply voltage in the semiconductor device 102. A third interlayer insulating film 8c is formed on the second interlayer insulating film 8b. A second interconnect 9b and second vias 10b connected to the second interconnect 9b are formed in the third interlayer insulating film 8c. The second interconnect 9b is connected to the first vias 10a, transmits a signal, and supplies a power supply voltage in the semiconductor device 102. Electrode pads 11 connected to the second vias 10b and for extracting signals to the outside are formed on the third interlayer insulating film 8c.

As shown in FIG. 9, through-holes 20 are formed to penetrate the semiconductor substrate 1 from the first surface 1a to a second surface 1b. In this variation, insulating regions are, for example, isolations 6 formed in the surface portion of the semiconductor substrate 1 around the through-holes 20 at the first surface 1a. Each of the through-holes 20 is also formed in one of the insulating regions and the first interlayer insulating film 8a to reach the first interconnect 9a. An insulating film 21 is formed on the inner walls of the through-holes 20 and on the second surface 1b. A barrier film 22 is formed on the inner walls of the through-holes 20 with the insulating film 21 interposed therebetween. The barrier film 22 is also formed on the surface (lower surface) of the first interconnect 9a in the corresponding one of through-holes 20. Conductive portions 23, which serve as through electrodes, are formed to fill the through-holes 20 provided with the insulating film 21 and the barrier film 22. This electrically connects each of the conductive portions 23 to the first interconnect 9a. The insulating film 21 electrically insulates the semiconductor substrate 1 from the conductive portions 23. The barrier film 22 prevents a conductive material forming the conductive portions 23 from being diffused into the semiconductor substrate 1. In order to reduce contact resistance between the first interconnect 9a and the corresponding one of the conductive portions 23 serving as the through electrodes, the thickness of the barrier film 22 on the surface (lower surface) of the first interconnect 9a in the corresponding one of the through-holes 20 is preferably reduced as much as possible by a known technique such as resputtering or the barrier film 22 itself is preferably removed.

In the semiconductor device 102 according to this variation, as shown in FIG. 9, gettering sites 30 are formed around the through-holes 20, i.e., the through electrodes, under the insulating regions which are the isolations 6 formed in the surface portion of the semiconductor substrate 1 at the first surface 1a.

According to this variation described above, in addition to advantages similar to the first embodiment, the through electrodes (i.e., the conductive portions 23) can be reliably insulated from the semiconductor substrate 1 near the first surface 1a of the semiconductor substrate 1. Specifically, in the first embodiment, if the thickness of the insulating film 21 deposited on the inner walls of the through-holes 20 is insufficient near the first surface 1a of the semiconductor substrate 1, an insulation failure occurs between the through electrodes and the semiconductor substrate 1. Then, the potential of the through electrodes becomes substantially equal to the potential of the semiconductor substrate 1. This may cause a bad influence on the operation of the elements. By contrast, in this variation, the insulating regions (i.e., the isolations 6) are formed in advance in the surface portion of the semiconductor substrate 1 at the first surface 1a. This improves insulation reliability between the through electrodes and the semiconductor substrate 1 in the surface portion of the semiconductor substrate 1 at the first surface 1a, in which the insulating film 21 is difficult to form with a sufficient thickness on the inner walls of the through-holes 20.

While in this variation, the isolations 6 are formed around the through-holes 20 in the surface portion of the semiconductor substrate 1 at the first surface 1a, other insulating regions, preferably, insulating region having a same depth as the isolations 6 may be formed.

In this variation, the minimum distance from the center of a through-hole 20 to the corresponding gettering site 30 is preferably shorter than the minimum distance from the center of the through-hole 20 to the corresponding active element formation region of the semiconductor substrate 1. This efficiently getters the metal which is a source of contamination.

While in the semiconductor device 102 according to this variation shown in FIG. 9, a double-layer interconnect structure is shown as an example, the number of the interconnect layers may be changed as appropriate. That is, the present disclosure is clearly not limited to the double-layer interconnect structure.

A method of manufacturing the semiconductor device according to a variation of the first embodiment will be described hereinafter with reference to the drawings.

FIGS. 10A-10C, and 11A-11C are cross-sectional views illustrating steps of the method of manufacturing the semiconductor device according to the variation of the first embodiment. The method of manufacturing the semiconductor according to this variation shares common features with the method of manufacturing the semiconductor device according to the first embodiment. Thus, in FIGS. 10A-10C and 11A-11C, the same reference characters as those in the first embodiment are used to represent equivalent elements. Differences from the first embodiment will be mainly described below.

Figure 10A:
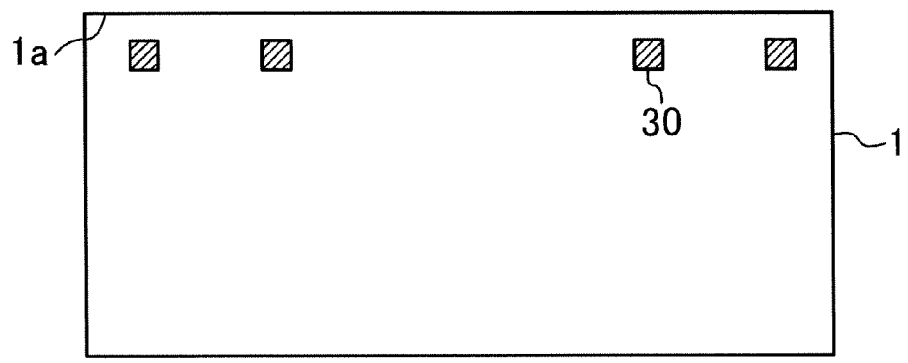
FIGS. 10A-10C are cross-sectional views illustrating steps of a method of manufacturing the semiconductor device according to the variation of the first embodiment.

First, as shown in FIG. 10A, a resist pattern (not shown) is formed on the first surface (element formation surface) 1a of the semiconductor substrate 1 using a known technique such as lithography. The resist pattern has openings with, for example, a width ranging from about 50 nm to about 1000 nm (preferably from about 200 nm to about 500 nm) around through electrode formation regions. Then, for example, He ions are implanted into the first surface 1a of the semiconductor substrate 1 under the conditions of implantation energy of 200 keV, and a dose of $1 \times 10^{17}$ atom/cm$^2$ using the resist pattern as a mask. As a result, crystal defects with density of about $1 \times 10^{10}$/cm$^3$ or more is formed to a depth ranging from about 0.5 μm to about 1.0 μm from the first surface 1a of the semiconductor substrate 1, and the regions with the crystal defects function as the gettering sites 30.

While in this variation, the He ions are implanted to form the gettering sites 30, the present disclosure is not limited thereto. For example, ions of, for example, Si, Ar, As, B, O, F, C or Ge, or two or more of them may be implanted. The implantation conditions may be optimized depending on the ions.

Figure 10B:
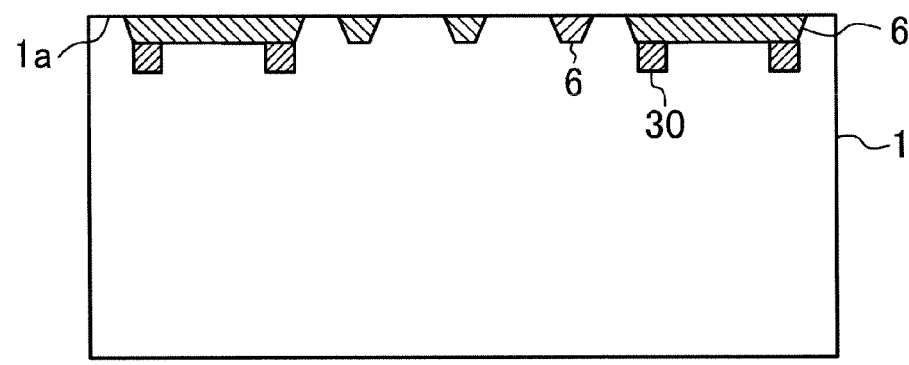

Next, as shown in FIG. 10B, the isolations 6 for electrically insulating the active elements from each other are formed in the surface portion of the semiconductor substrate 1 at the first surface 1a. In this variation, in addition to the active element formation region, the isolations 6 are formed in and around the through-hole formation regions. In and around the through-hole formation regions, the isolations 6 are formed so that the gettering sites 30 are positioned under the isolations 6.

Figure 10C:
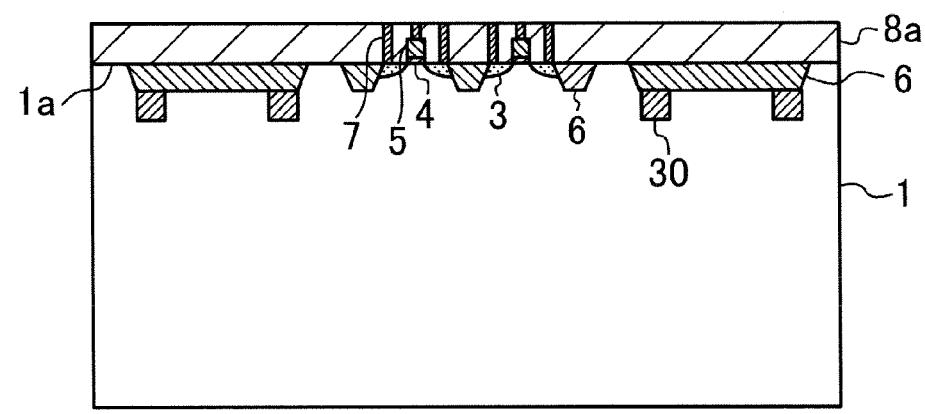

After that, as shown in FIG. 10C, the impurity regions 3 of the active elements such as transistors and diodes are formed in the surface portion of the semiconductor substrate 1 at the first surface 1a. Next, after the gate electrodes 5 are formed on the first surface 1a of the semiconductor substrate 1 with the gate insulating film 4 interposed therebetween, the first interlayer insulating film 8a is formed on the first surface 1a of the semiconductor substrate 1 to cover the gate electrodes 5. Then, the contacts 7 connected to the impurity regions 3 and the gate electrodes 5 are formed in the first interlayer insulating film 8a.

Figure 11A:
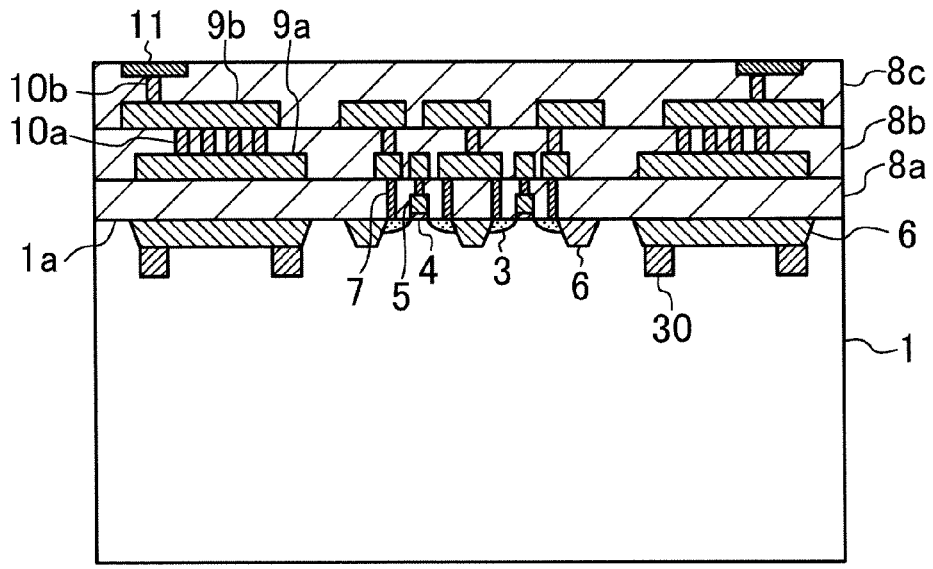
FIGS. 11A-11C are cross-sectional views illustrating steps of the method of manufacturing the semiconductor device according to the variation of the first embodiment.

Then, as shown in FIG. 11A, after the second interlayer insulating film 8b is formed on the first interlayer insulating film 8a, the first interconnect 9a and the first vias 10a connected to the first interconnect 9a are formed in the second interlayer insulating film 8b. The first interconnect 9a is connected to the contacts 7, transmits a signal, and supplies a power supply voltage in the semiconductor device. Then, after the third interlayer insulating film 8c is formed on the second interlayer insulating film 8b, the second interconnect 9b and the second vias 10b connected to the second interconnect 9b are formed in the third interlayer insulating film 8c. The second interconnect 9b is connected to the first vias 10a, transmits a signal, and supplies a power supply voltage in the semiconductor device. After that, the electrode pads 11 connected to the second vias 10b and for extracting signals to the outside are formed on the third interlayer insulating film 8c.

Figure 11B:
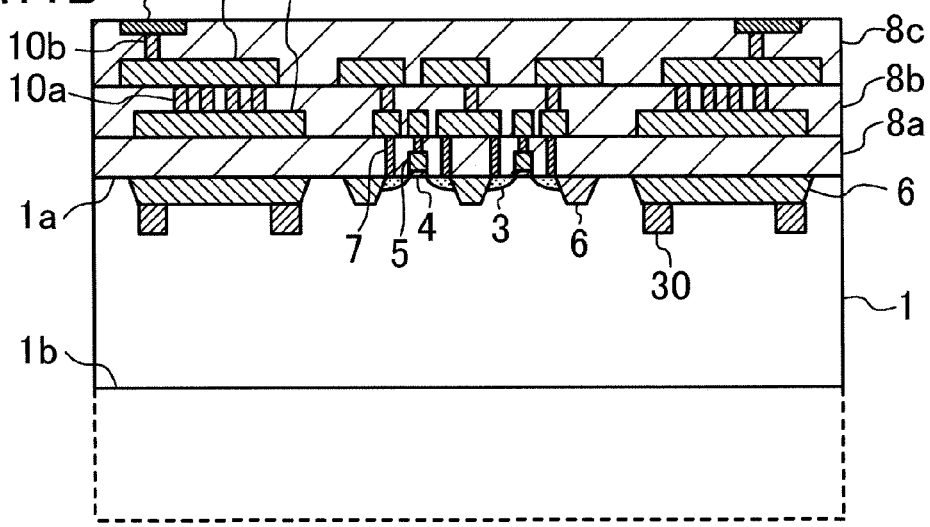

Then, as shown in FIG. 11B, the thickness of the semiconductor substrate 1 is reduced from the surface of the semiconductor substrate 1 opposite to the first surface 1a to an eventual thickness ranging from about 5 µm to about 100 µm (preferably from about 20 µm to about 50 µm). A new surface apparent at the side of the semiconductor substrate 1 opposite to the first surface 1a is the second surface 1b. In this variation, in the step of reducing the thickness of the substrate, for example, mechanical cutting/polishing such as grinding, chemical polishing such as CMP, dry etching, or wet etching may be used.

In the step of reducing the thickness of the substrate, the smaller the eventual thickness of the substrate is, the smaller the strength of the substrate is, thereby causing problems such as cracks. In order to reduce the problems, in the step of reducing the thickness of the substrate or a subsequent step, the substrate may be reinforced by bonding a support substrate on the top of the substrate using an adhesive, etc.

Figure 11C:
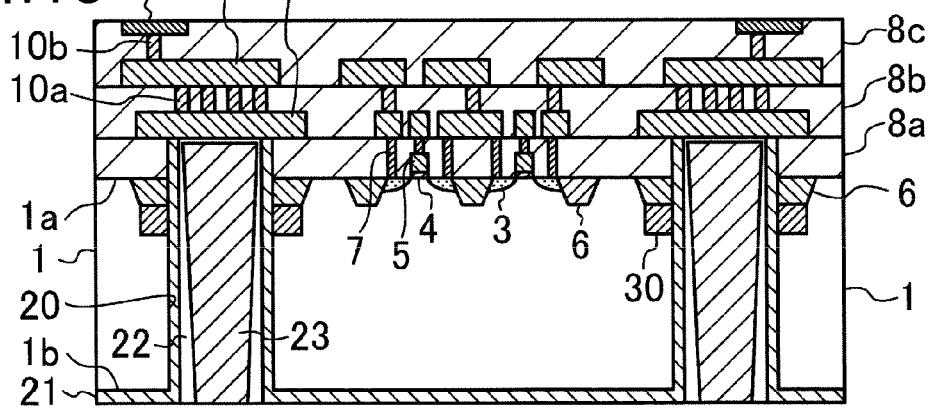
Figure 13:
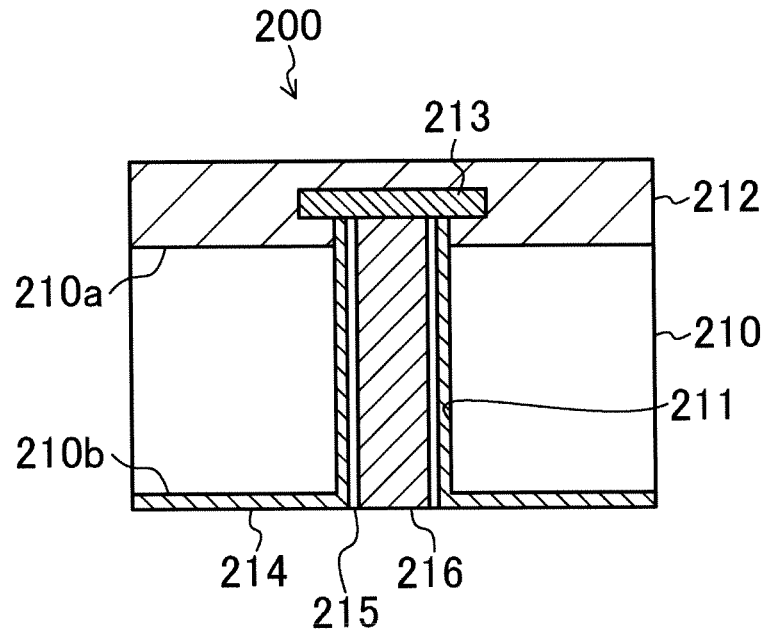
FIG. 13 is a cross-sectional view of a conventional semiconductor device including a through electrode.
Figure 14:
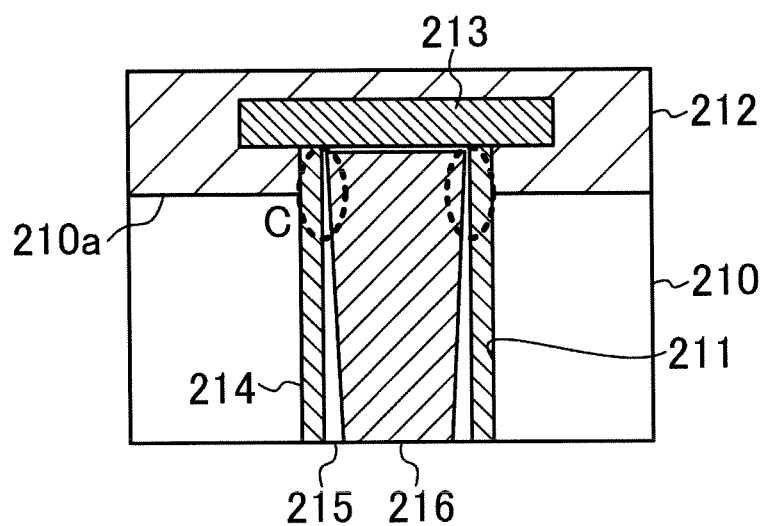
FIG. 14 illustrate problems at and around the connecting portion between the through electrode and an interconnect.

Next, as shown in FIG. 11C, each of the through-holes 20, which penetrates the semiconductor substrate 1, the isolations 6, and the first interlayer insulating film 8a to reach the first interconnect 9a, is formed from the second surface 1b of the semiconductor substrate 1. The size of each through-hole 20 ranges, for example, from about 0.1 µm to about 20 µm (preferably from about 0.5 µm to 10 µm). Note that the through-holes 20 are formed to avoid the active element formation regions. The through-holes 20 are formed so that the gettering sites 30 surround the through-holes 20. The through-holes 20 are formed by a method similar to the first embodiment. Each of the gettering sites 30 may also be formed in one of the through-hole formation regions in the step shown in FIG. 10A so that the corresponding one of the through-holes 20 is reliably in contact with the gettering site 30.

After that, as shown in FIG. 11C, the insulating film 21 is formed on the second surface 1b and on the inner walls of the through-holes 20 from the second surface 1b of the semiconductor substrate 1. The insulating film 21 may be made of, for example, $SiO_2$, etc. The insulating film 21 formed on the surface (lower surface) of the first interconnect 9a in the corresponding one of through-holes 20 is removed by, for example, dry etching, wet etching, etc.

Then, as shown in FIG. 11C, the barrier film 22 is formed on the inner walls of the through-holes 20 from the second surface 1b of the semiconductor substrate 1 with the insulating film 21 interposed between the barrier film 22 and the inner walls of the through-holes 20. The barrier film 22 is preferably made of a material having characteristics as a barrier against the conductive material forming the through electrodes. The barrier film 22 may be made of, for example, Ta, TaN, Ti, TiN, etc., or a combination thereof.

The barrier film 22 is also formed on the surface (lower surface) of the first interconnect 9a in the corresponding one of through-holes 20. The barrier film 22 tends to be thin on the inner walls of the through-holes 20 near the first surface (i.e., the element formation surface) 1a. However, in this variation, the gettering sites 30 are formed around the through-holes 20, in which the barrier film 22 tends to be thin, to address metal contamination caused by the metal material forming the through electrodes. This allows the gettering sites 30 to reliably capture contaminated metal, thereby reducing diffusion of the contaminated metal into the semiconductor substrate 1. Therefore, malfunctions of the active elements caused by the unintended metal contamination can be reliably reduced, thereby improving the reliability of the semiconductor device including the through electrodes.

Finally, as shown in FIG. 11C, the conductive portions 23 which serve as through electrodes are formed to fill the through-holes 20 provided with the insulating film 21 and the barrier film 22. The conductive portions 23 are made of, for example, Cu, W, Au, Ni, etc. A most suitable means for filling the conductive portions 23 is selected depending on the conductive material to be used. The means for filling the conductive portions 23 may be, for example, electrolytic plating, non-electrolytic plating, chemical vapor deposition, etc.

While in this variation, the gettering sites 30 are formed before forming the through-holes 20, the gettering sites 30 may be formed after forming the through-holes 20, or after forming the conductive portions (i.e., the through electrodes) 23.

By forming a stacked semiconductor device by stacking a plurality of semiconductor devices including at least one of the semiconductor device according to this variation, as compared to a conventional stacked semiconductor device using wire bonding, the smaller stacked semiconductor device not requiring an area for drawing around wires can be provided. Specifically, for example, in the stacked semiconductor device shown in FIG. 5, the semiconductor devices according to this variation shown in FIG. 9 may be stacked in place of the semiconductor devices according to the first embodiment shown in FIG. 1A.

While in this variation, each gettering site 30 surrounding the through electrode (i.e., the conductive portion 23) may have a circular shape (a doughnut shape), or a polygonal shape such as a rectangular shape as viewed from above. If the gettering site 30 has sufficient gettering properties, there is no need for the gettering site 30 to surround the entire circumference of the corresponding one of the through electrodes. The gettering sites 30 may be located in a determined direction viewed from a through electrode. While in the semiconductor device according to this variation shown in FIG. 9, the gettering site 30 is formed in contact with the insulating film 21 covering the through electrode, the present disclosure is not limited thereto. In view of misalignment, a space of, for example, about 1 µm may be provided between each gettering site 30 and the insulating film 21 covering the through electrodes.

For design reasons, where a through electrode group formed by densely arranging a plurality (e.g., three or more) of through electrodes, and no active element is formed between the through electrodes forming the through electrode group, a gettering site 30 may be formed not to surround the through electrodes individually, but to surround the through electrode group as a whole.

While in the semiconductor device according to this variation, as shown in FIG. 9, the sizes of the through-holes 20 are the same from the first surface 1a to the second surface 1b, the present disclosure is not limited thereto. The sizes of the through-holes 20 near the first surface 1a may be smaller than the sizes of the through-holes 20 near the second surface 1b. With this structure, the area for the through electrodes at the first surface 1a (i.e., the element formation surface) is reduced, thereby providing the semiconductor device 102 including the through electrodes with high area efficiency. Specifically, the entire inner wall of each through-hole 20 may have a taper cross-sectional shape so that the size of the through-hole 20 gradually decreases from the second surface 1b toward the first surface 1a. Alternatively, part of the inner wall of each through-hole 20 (near the second surface 1b) may have a taper cross-sectional shape, and the other part of the inner wall of the through-hole 20 (near the first surface 1a) may have a vertical cross-sectional shape.

In this variation, each through-hole 20 may have a circular shape as viewed from above. If other shapes are desired for design, process reasons, etc., the planar shape of each through-hole 20 may be other than the circular shape, and may be, for example, a polygonal shape, an oval shape, etc.

While in the semiconductor device according to this variation, as shown in FIG. 9, each of the through electrodes (i.e., the conductive portions 23) is directly connected to the first interconnect 9a, the present disclosure is not limited thereto. The through electrode may be directly connected to the second interconnect 9b, or the electrode pads 11. Alternatively, as shown in FIG. 12A, each through-hole 20 (i.e., each through electrode) may be formed only in the semiconductor substrate 1 other than the isolations 6. That is, the through-hole 20 is formed from a lower surface of the insulating region to the second surface 1b. In other words, the through-hole 20 (i.e., the through electrode) is not formed in the isolation 6 and the first interlayer insulating film 8a, and the through electrode (i.e., the conductive portion 23) is electrically connected to the first interconnect 9a by at least one of the contacts 7 formed in the isolation 6 and the first interlayer insulating film 8a. Alternatively, as shown in FIG. 12B, each through-hole 20 (i.e., each through electrode) is formed only in the semiconductor substrate 1 including the isolation 6. In other words, the through-hole 20 (i.e., the through electrode) may not be formed in the first interlayer insulating film 8a, and the through electrode (i.e., the conductive portion 23) may be electrically connected to the first interconnect 9a by at least one of the contacts 7 formed in the first interlayer insulating film 8a.

What is claimed is:

1. A semiconductor device comprising:
a semiconductor substrate having a first surface being an element formation surface, and a second surface opposite to the first surface;
a through-hole formed to penetrate the semiconductor substrate from the first surface to the second surface;
an insulating film formed on an inner wall of the through-hole;
a barrier film formed on the inner wall of the through-hole with the insulating film interposed therebetween; and
a conductive portion formed to fill the through-hole provided with the insulating film and the barrier film,
wherein a gettering site is formed in a portion of the semiconductor substrate around the through-hole near the first surface only.

2. The semiconductor device of claim 1, wherein a minimum distance from a center of the through-hole to the gettering site is shorter than a minimum distance from the center of the through-hole to an active element formation region in the semiconductor substrate.

3. The semiconductor device of claim 1, wherein the gettering site is formed to surround the through-hole.

4. The semiconductor device of claim 1, wherein a size of the through-hole decreases from the second surface toward the first surface.

5. The semiconductor device of claim 1, wherein
an interconnect is formed on the first surface of the semiconductor substrate, and
the conductive portion is electrically connected to the interconnect.

6. The semiconductor device of claim 5, wherein the conductive portion is electrically connected to the interconnect by a contact interposed between the conductive portion and the interconnect.

7. The semiconductor device of claim 1, wherein
the through-hole includes a plurality of through-holes, and
the gettering site is formed to surround a through-hole group formed by two-dimensionally arranging three or more of the plurality of through-holes.

8. A stacked semiconductor device formed by stacking a plurality of semiconductor devices,
wherein at least one of the semiconductor devices is the semiconductor device of claim 1.

9. The semiconductor device of claim 1, wherein the gettering site is spaced apart from an active element formation region in the semiconductor substrate.

10. The semiconductor device of claim 1, wherein a thickness of the barrier film in the through-hole is smaller at the first surface than at the second surface.

11. A semiconductor device comprising:
a semiconductor substrate having a first surface being an element formation surface, and a second surface opposite to the first surface;
a through-hole formed to penetrate the semiconductor substrate from the first surface to the second surface;
an insulating film formed on an inner wall of the through-hole;
a barrier film formed on the inner wall of the through-hole with the insulating film interposed therebetween; and
a conductive portion formed to fill the through-hole provided with the insulating film and the barrier film,
wherein
a gettering site is formed in a portion of the semiconductor substrate around the through-hole at least near a side of the first surface,
the through-hole includes a plurality of through-holes, and
the gettering site is formed to surround a through-hole group formed by two-dimensionally arranging three or more of the plurality of through-holes.

12. The semiconductor device of claim 11, wherein a minimum distance from a center of the through-hole to the gettering site is shorter than a minimum distance from the center of the through-hole to an active element formation region in the semiconductor substrate.

13. The semiconductor device of claim 11, wherein the gettering site is formed to surround the through-hole.

14. The semiconductor device of claim 11, wherein a size of the through-hole decreases from the second surface toward the first surface.

15. The semiconductor device of claim 11, wherein
an interconnect is formed on the first surface of the semiconductor substrate, and
the conductive portion is electrically connected to the interconnect.

16. The semiconductor device of claim 15, wherein the conductive portion is electrically connected to the interconnect by a contact interposed between the conductive portion and the interconnect.

17. A stacked semiconductor device formed by stacking a plurality of semiconductor devices,
wherein at least one of the semiconductor devices is the semiconductor device of claim 11.

18. The semiconductor device of claim 11, wherein
an insulating region is formed in a surface portion of the semiconductor substrate around the through-hole at a side of the first surface, and
the gettering site is formed under the insulating region.

19. The semiconductor device of claim 18, wherein
an isolation is formed in the surface portion of the semiconductor substrate at the side of the first surface, and
the insulating region is formed to a substantially same depth as the isolation.

20. The semiconductor device of claim 18, wherein the through-hole is formed from a lower surface of the insulating region to the second surface.

\* \* \* \* \*